United States Patent
Endoh et al.

(10) Patent No.: US 9,240,256 B2
(45) Date of Patent: *Jan. 19, 2016

(54) BONDING MATERIAL AND BONDING METHOD USING THE SAME

(75) Inventors: Keiichi Endoh, Okayama (JP); Yutaka Hisaeda, Okayama (JP); Akihiro Miyazawa, Okayama (JP); Aiko Nagahara, Okayama (JP); Toshihiko Ueyama, Okayama (JP)

(73) Assignee: DOWA ELECTRONICS MATERIALS CO., LTD., Tokyo (JP)

(*) Notice: Subject to any disclaimer, the term of this patent is extended or adjusted under 35 U.S.C. 154(b) by 520 days.

This patent is subject to a terminal disclaimer.

(21) Appl. No.: 13/576,014

(22) PCT Filed: Apr. 23, 2010

(86) PCT No.: PCT/JP2010/057293
§ 371 (c)(1),
(2), (4) Date: Jul. 30, 2012

(87) PCT Pub. No.: WO2011/114543
PCT Pub. Date: Sep. 22, 2011

(65) Prior Publication Data
US 2012/0298009 A1    Nov. 29, 2012

(30) Foreign Application Priority Data
Mar. 15, 2010 (JP) .................. 2010-058370

(51) Int. Cl.
*C09J 11/06* (2006.01)
*H01B 1/02* (2006.01)
(Continued)

(52) U.S. Cl.
CPC .............. *H01B 1/02* (2013.01); *B22F 1/0014* (2013.01); *B22F 1/0018* (2013.01);
(Continued)

(58) Field of Classification Search
None
See application file for complete search history.

(56) References Cited

U.S. PATENT DOCUMENTS 8,293,142 B2   10/2012   Hisaeda et al.
8,293,144 B2   10/2012   Hisaeda et al.
(Continued)

FOREIGN PATENT DOCUMENTS

CN    1564726      1/2005
JP    2006-095534  4/2006
(Continued)

OTHER PUBLICATIONS

International Search Report issued with respect to PCT/JP2010/057293, mailed Jul. 20, 2010.
(Continued)

*Primary Examiner* — Melissa Swain
(74) *Attorney, Agent, or Firm* — Greenblum & Bernstein, P.L.C.

(57) ABSTRACT

A method of forming a bonded product using metal nanoparticles is provided. More specifically, provided is a paste containing a flux component that can form a metal phase even in an inert atmosphere. The use of this paste allows a bonding material that can give a practically acceptable bonding strength to be provided in an inert atmosphere such as a nitrogen atmosphere at low temperatures without performing conventionally used pressurization. The paste is a bonding material configured to include: silver nanoparticles having an average primary particle diameter of 1 to 200 nm and coated with an organic material having 8 or less carbon atoms; a flux component having at least two carboxyl groups; and a dispersion medium. The use of this bonding material allows materials to be bonded even at a temperature of 300° C. or lower.

4 Claims, 6 Drawing Sheets

(51) Int. Cl.
*B22F 1/00* (2006.01)
*B82Y 30/00* (2011.01)
*H01L 23/00* (2006.01)
*H05K 3/32* (2006.01)
*B22F 7/06* (2006.01)
*B22F 9/24* (2006.01)
*C22C 5/06* (2006.01)
*H05K 3/34* (2006.01)

(52) U.S. Cl.
CPC ............ *B22F 1/0062* (2013.01); *B22F 7/064* (2013.01); *B22F 9/24* (2013.01); *B82Y 30/00* (2013.01); *C09J 11/06* (2013.01); *C22C 5/06* (2013.01); *H01L 24/29* (2013.01); *H01L 24/83* (2013.01); *H05K 3/32* (2013.01); *B22F 2303/01* (2013.01); *B22F 2999/00* (2013.01); *H01L 2224/2949* (2013.01); *H01L 2224/29339* (2013.01); *H01L 2224/83011* (2013.01); *H01L 2224/83075* (2013.01); *H01L 2224/8384* (2013.01); *H01L 2924/014* (2013.01); *H01L 2924/01005* (2013.01); *H01L 2924/0105* (2013.01); *H01L 2924/01006* (2013.01); *H01L 2924/01023* (2013.01); *H01L 2924/01024* (2013.01); *H01L 2924/01029* (2013.01); *H01L 2924/01033* (2013.01); *H01L 2924/01047* (2013.01); *H01L 2924/01074* (2013.01); *H01L 2924/0665* (2013.01); *H01L 2924/1301* (2013.01); *H01L 2924/1305* (2013.01); *H01L 2924/1306* (2013.01); *H01L 2924/13033* (2013.01); *H01L 2924/13055* (2013.01); *H01L 2924/13091* (2013.01); *H01L 2924/15747* (2013.01); *H01L 2924/2011* (2013.01); *H01L 2924/20106* (2013.01); *H01L 2924/20107* (2013.01); *H01L 2924/20108* (2013.01); *H01L 2924/20109* (2013.01); *H01L 2924/20111* (2013.01); *H05K 3/3489* (2013.01); *H05K 2201/0257* (2013.01); *H05K 2203/086* (2013.01); *H05K 2203/1131* (2013.01)

(56) References Cited

U.S. PATENT DOCUMENTS

| | | | |
|---|---|---|---|
| 8,641,929 B2* | 2/2014 | Endoh et al. | 252/514 |
| 2004/0245648 A1 | 12/2004 | Nagasawa et al. | |
| 2006/0076387 A1 | 4/2006 | Ogure et al. | |
| 2008/0173398 A1* | 7/2008 | Yasuda et al. | 156/326 |
| 2009/0148600 A1 | 6/2009 | Li et al. | |
| 2010/0221559 A1* | 9/2010 | Konno et al. | 428/457 |
| 2011/0155968 A1 | 6/2011 | Iha et al. | |
| 2011/0272642 A1 | 11/2011 | Hisaeda et al. | |
| 2012/0103515 A1 | 5/2012 | Endoh et al. | |

FOREIGN PATENT DOCUMENTS

| | | |
|---|---|---|
| JP | 2007-077479 | 3/2007 |
| JP | 2007-207577 | 8/2007 |
| JP | 2008-161907 | 7/2008 |
| JP | 2008-212976 A | 9/2008 |
| JP | 2009-097074 A | 5/2009 |
| JP | 2009-104807 | 5/2009 |
| JP | 2009-120923 | 6/2009 |
| JP | 2009-227736 A | 10/2009 |
| JP | 2009-267374 | 11/2009 |
| JP | 2009-279649 | 12/2009 |
| TW | 2009-27870 | 7/2009 |

OTHER PUBLICATIONS

Morita et al., "Development of lead-free bonding technology for high-temperature environment using silver oxide particles of micrometer size", Materia, vol. 49, No. 1, 2010, pp. 20-22, including English-language abstract.

U.S. Appl. No. 13/576,073 to Toshihiko Ueyama et al., filed Jul. 30, 2012.

Office Action for Chinese Patent Application No. 201080065477.8, which was mailed on Feb. 8, 2014.

Partial Supplemental European Search report issued with respect to application No. 10847952.8, mail date is Jun. 19, 2015.

Zhou Yin-Zhuang et al., "Hydrothermal synthesis, crystal structure and fluorescent properties of a novel 1D polymer: VO2(C7H3O4N)Ag(C10H8N2).H2O", Inorganic Chemistry Communications, 12 (2009), pp. 243-245.

Database WPI Week 200968 Thomson Scientific, London, GB; XP002739211, 2009.

* cited by examiner

BONDING MATERIAL AND BONDING METHOD USING THE SAME

FIELD

The present invention relates to a bonding material and a bonding method using the same.

BACKGROUND

As electric currents flowing through electronic components used in automobiles and industrial machines increase, the operating temperatures of the semiconductors used inside these electronic components tend to increase. Therefore, there is a strong demand for bonding materials that can resist such a high-temperature environment. Conventionally, lead-containing solder that can maintain its strength at high temperatures has been used. However, with the recent trend of reducing the amount of lead used, there is a strong demand to provide a bonding method suitable for such a requirement.

As a candidate of the bonding method that can meet the above requirements, a bonding method using silver nanoparticles is recently receiving attention. In this method, no lead is used, and bonding can be achieved under temperature conditions lower than those for bulk silver. For example, in one method proposed under the above circumstances, a mixture of silver oxide particles and myristyl alcohol is used as a bonding material (Non Patent Literature 1 and Patent Literature 1). In another proposed method, carboxylic acid is added to a mixture of silver nanoparticles and silver carbonate or silver oxide, and the resultant mixture is used as a bonding material (Patent Literature 2).

CITATION LIST

Patent Literature

Patent Literature 1: Japanese Patent Application Laid-Open No. 2009-267374
Patent Literature 2: Japanese Patent Application Laid-Open No. 2009-279649

Non Patent Literature

Non Patent Literature 1: "Development of lead-free bonding technology for high-temperature environment using silver oxide particles of micrometer size," Morita et al., Materia, Vol. 49, No. 1 (2010)

SUMMARY

Technical Problem

In the bonding method using silver, some degree of pressurization must generally be performed, for example, from above during bonding, as described in the technology described in Non Patent Literature 1 and the like. To apply such a technology, an apparatus that can perform at least pressurization and heating simultaneously must be used, and therefore this technology somewhat lacks versatility. Another problem of this technology is that it cannot be used for a material having only a mechanical strength not high enough to resist pressurization. Therefore, if a paste that can provide an appropriate bonding strength without pressurization can be provided, the range of object materials to which the technology can be applied is expected to be significantly increased.

A bonded product is formed in an oxidative atmosphere containing oxygen, for example, at least in the air. Therefore, it is feared that silver oxide, which may adversely affect the bonding strength, is formed in the interface portion. Such an influence may be significant particularly on fine bonded products. Therefore, if a bonding material can be provided which can provide a sufficient bonding strength in an inert atmosphere such as a nitrogen atmosphere in which the above-described influence can be eliminated, the range of use fields of the paste and the range of potential use of the paste are expected to be significantly increased.

Accordingly, the present invention provides a bonding material that can form a bonded product in nitrogen and can provide a bonding strength high enough for practical use without pressurization and heat treatment at high temperatures.

Solution to Problems

The present inventors have made extensive studies to solve the above problems and found that the following bonding material can provide a strength high enough for practical use even when a bonded product is formed in an acting environment that has not been usable. Thus, the invention has been completed.

More specifically, the foregoing problems can be solved by providing a bonding material configured to include: silver nanoparticles having an average primary particle diameter of 1 to 200 nm and coated with an organic material having 8 or less carbon atoms; a flux component having at least two carboxyl groups; and a dispersion medium.

The bonding material having the above-described configuration may be configured to further include silver particles having an average particle diameter of 0.5 μm or larger and 3.0 μm or smaller.

More preferably, in the bonding material, the flux component has an ether bond and a dicarboxylic acid structure.

Particularly, in the bonding material, the flux component may be oxydiacetic acid having an ether linkage and a dicarboxylic acid structure.

Particularly, in the bonding material including the flux component, the number of carbon atoms of the organic material with which the surfaces of the silver nanoparticles are coated may be 6.

In the bonding material including the silver nanoparticles and the flux component described above, the dispersion medium constituting the bonding material may be a polar material.

The technical content provided by the present invention is a bonding method that uses a bonding material having any of the above-described configurations. More specifically, the bonding method uses silver nanoparticles, and particularly the bonding material used contains a flux component. A material having a dicarboxylic acid structure having at least two carboxyl groups is used as the flux component.

Particularly, the bonding method is characterized in that the flux component used has the dicarboxylic acid structure having at least two carboxyl groups and also has an ether linkage.

In the bonding method, a bonded product bonded using the above-described bonding material may be formed in an inert gas atmosphere such as a nitrogen atmosphere.

In the bonding method, the bonding may be performed under heating at 500° C. (773 K) or lower.

Advantageous Effects of Invention

The use of the bonding material disclosed in the present invention allows a bonded product having a bonding strength high enough for practical use to be formed even in a nitrogen environment. In addition, a bonded product having a bonding strength equivalent to that obtained by using conventionally used solder can be provided even without pressurization during heating.

DESCRIPTION OF EMBODIMENTS

<Silver Nanoparticles>

Figure 1:
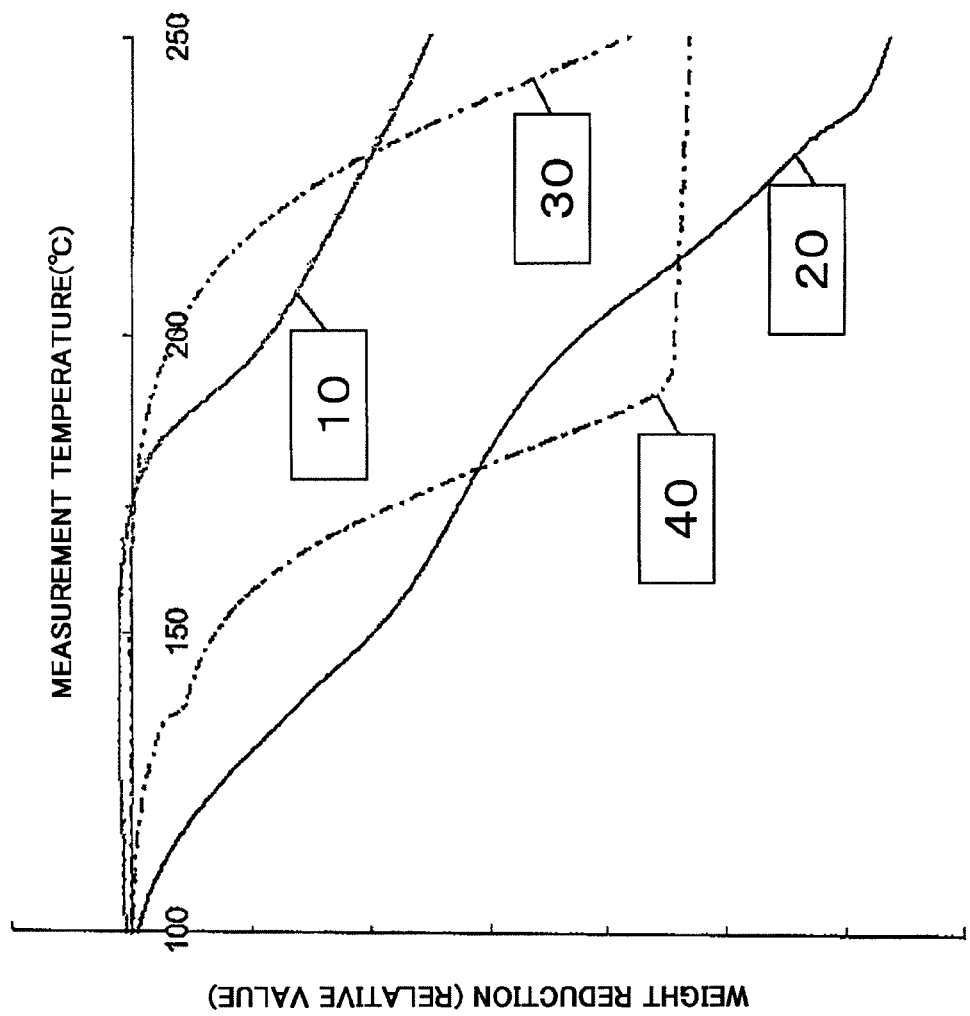
FIG. 1 is a TG diagram of each of a bonding material according to the present invention, a raw material powder, an additive, and a surface coating material, as measured at a sweep rate of 10° C./min. The vertical axis represents the relative value of the amount of reduction that is different from the actual value.

The silver nanoparticles used in the present invention have an average primary particle diameter of 1 to 200 nm, preferably 1 to 150 nm, and more preferably 10 to 100 nm as computed from a transmission electron microscope (TEM) photograph. The use of the particles having such a particle diameter allows a bonded product having a high bonding strength to be formed.

In the evaluation using the transmission electron microscope, 2 parts by mass of washed metal nanoparticles is added to a mixed solution of 96 parts by mass of cyclohexane and 2 parts by mass of oleic acid and are dispersed using ultrasonic waves. Then the dispersion is dropped onto a Cu microgrid with a support film and then dried to obtain a TEM specimen. The particles on the produced microgrid are observed under the transmission electron microscope (type JEM-100CX-Mark-II, product of JEOL Ltd.) at an acceleration voltage of 100 kV, and a bright field image of the particles is taken at a magnification of 300,000×.

The diameters of the particles in the obtained photograph may be directly measured using, for example, a vernier caliper or may be computed using image software. The average primary particle diameter is computed as the number average of the diameters of at least 200 independent particles in the TEM photograph.

The silver nanoparticles used in the present invention have the particle diameter described above and are coated with an organic material. An organic material having 8 or less carbon atoms can be preferably used. An organic material having 8 or less carbon atoms and having at least one carboxyl group can be particularly preferably used. Specific examples of such an organic material include, but not limited to: saturated fatty acids such as octanoic acid (caprylic acid), heptanoic acid (enanthic acid), hexanoic acid (caproic acid), pentanoic acid (valeric acid), butanoic acid (butyric acid), and propanoic acid (propionic acid); dicarboxylic acids such as oxalic acid, malonic acid, methylmalonic acid, ethylmalonic acid, succinic acid, methylsuccinic acid, ethylsuccinic acid, phenylsuccinic acid, glutaric acid, adipic acid, pimelic acid, and suberic acid; and unsaturated fatty acids such as sorbic acid and maleic acid.

When the surfaces of the silver nanoparticles are coated with one of the above organic materials, particularly hexanoic acid, heptanoic acid, adipic acid, sorbic acid, or malonic acid, the particles can be easily produced and provided in a powder form. Such a powder form is preferable because the provided particles can be easily mixed when a bonding material is formed as in the present invention. The particles having surfaces coated with such a material aggregate with the form of primary particles being maintained and can be easily collected. The aggregated clusters obtained have a diameter equal to or larger than 2.5 μm which can be collected at least using JIS P-3801 No. 5C. However, this diameter of the aggregated (secondary) particles merely means that the particles can be separated by filtration. More specifically, the diameter of the aggregated particles is different from the average particle diameter (D50) of the silver particles (if the D50 value is used, the number of aggregated clusters that pass through the filter paper is large, and therefore the collection efficiency is low. However, the particles according to the present invention do not pass through the filter paper, and the filtrate obtained is clear. Therefore, it can be construed that the aggregated clusters have a size of at least about 2.5 μm, but this is not an average value). When drying operation at low temperatures (less than 100° C.) is added to the method, dry particles can be collected. Therefore, to design a bonding material, particles coated with molecules that can provide the above size are preferably used.

Silver nanoparticles coated with a plurality of organic materials may be used, or different types of silver nanoparticles having different average primary particle diameters may be used.

<Silver Particles>

When silver particles of the order of submicrons are added in addition to the above-described silver nanoparticles, the bonding strength can be improved. More specifically, it is preferable to use silver particles having an average particle diameter of 0.5 μm or lager. In the present description, the average particle diameter is computed using a laser diffraction method. More specifically, 0.3 g of sample silver particles is added to 50 mL of isopropyl alcohol and dispersed for 5 minutes using an ultrasonic cleaner at a power of 50 W. Then the D50 value (cumulative 50 mass % particle diameter) is measured by the laser diffraction method using a microtrac particle size distribution analyzer (9320-X100, a product of Honeywell-NIKKISO Co., Ltd.) and is used as the average particle diameter. The measured average particle diameter is in the range of 0.5 to 3.0 μm, preferably 0.5 to 2.5 μm, and more preferably 0.5 to 2.0 μm. When such particles are also used, a bonded product with a high bonding strength can be provided.

<Dispersion Medium>

In the paste-like bonding material according to the present invention, the silver nanoparticles are dispersed in a dispersion medium. The dispersion medium used is preferably a polar solvent because it has a low vapor pressure and can be easily handled.

Specific examples of the dispersion medium used include, water, alcohols, polyols, glycol ethers, 1-methyl pyrrolidinone, pyridine, octanediol, terpineol, butyl carbitol, butyl carbitol acetate, texanol, phenoxypropanol, diethylene glycol monobutyl ether, diethylene glycol monobutyl ether acetate, γ-butyrolactone, ethylene glycol monomethyl ether acetate, ethylene glycol monoethyl ether acetate, methoxy butyl acetate, methoxy propyl acetate, diethylene glycol monoethyl ether acetate, ethyl lactate, and 1-octanol.

If necessary, a material that reduces sintering temperatures and facilitates adhesion may be added to the dispersion. Such an additive may have a viscosity adjusting function. The additive added to the dispersion may be a water-solubilizable resin or a water-dispersible resin. Specific examples of such an additive include acrylic resins, maleic resins, fumaric resins, high-acid value resins of styrene-maleic acid copolymer resins, polyester resins, polyolefin resins, phenoxy resins, polyimide resins, polyamide resins, vinyl acetate-based emulsions, acrylic emulsions, synthetic rubber latex, epoxy resins, phenolic resins, DAP resins, urethane resins, fluorocarbon resins, silicone resins, and ethyl cellulose, polyvinyl alcohol. Examples of inorganic binders include silica sol, alumna sol, zirconia sol, and titania sol. However, the addition of an excessive amount of such a resin is not preferred because the purity of the metal is reduced. The amount is preferably several parts by weight based on the total metal amount.

Specific names of the additives are listed below. However, the use of additives other than those in the following list is not exclusive, so long as they have the above-described properties. Examples of the acrylic resins include BR-102 resin and the like, (products of MITSUBISHI RAYON Co., Ltd.) and ARUFON UC-3000 resin and the like (products of Toagosei Co., Ltd.). Examples of the polyester resins include vylon 220 and the like, (products of Toyobo Co., Ltd.) and MALKYD No. 1 and the like (products of Arakawa Chemical Industries, Ltd.). Examples of the epoxy resins include ADEKA resin EP-4088S and the like, (products of Adeka Corporation) and 871 and the like (products of Japan Epoxy Resins Co., Ltd.). Examples of the phenolic resins include RESITOP PL-4348 and the like (products of Gunei Chemical Industry Co., Ltd.). Examples of the phenoxy resins include 1256 and the like, (products of Japan Epoxy Resins Co., Ltd.) and TAMANOL 340 and the like (products of Arakawa Chemical Industries, Ltd.). Examples of the DAP resins include DAP A and the like (products of Daiso Co., Ltd.). Examples of the urethane resins include Millionate MS-50 and the like (products of Nippon Polyurethane Industry Co., Ltd.). Examples of the ethyl cellulose include ETHOCEL STANDARD 4 and the like (products of Nisshin & Co., Ltd.). Examples of the polyvinyl alcohol include RS-1713 and the like (products of Kuraray Co., Ltd.).

<Flux Component>

In addition to the above-described components, an organic material used as a flux component is added to the bonding material according to the present invention. More specifically, dicarboxylic acid having at least two carboxyl groups, more preferably dicarboxylic acid having an ether linkage and at least two carboxyl groups, may be selected. The addition of the selected material having such a configuration allows the silver nanoparticles coated with the organic material to be converted to bulk silver even by heat treatment at relatively low temperatures in nitrogen.

Preferably, also the flux component is decomposed into as simple configurations as possible (more specifically, finally into carbon dioxide, water, and the like). Therefore, it is preferable that the flux component be an organic material composed only of elements such as carbon, hydrogen, and oxygen. The decomposition temperature of the flux component is preferably at least equal to or lower than the preset temperature of the heat treatment. From the viewpoint of decomposition, the molecular constitution of the flux component has a molecular weight of 1,000 or lower, preferably 500 or lower, and more preferably 300 or lower.

Examples of the flux component include glycolic acid having a dicarboxylic acid structure. However, excessively large molecules are not preferred because high temperature is required for decomposition. Preferably, the decomposition temperature is at least lower than the preset temperature of main firing. More specifically, a flux component having a decomposition temperature of 500° C. or lower and more preferably 300° C. or lower is selected. However, when a flux component that is directly vaporized without decomposition is used, the "decomposition temperature" is read as "evaporation (vaporization) temperature."

More specifically, the total number of carbon atoms in the structure is at most 15 or less and preferably 10 or less. A structure having such a number of carbon atoms can be decomposed or vaporized at relatively low temperatures around bonding temperature.

<Dispersant>

A dispersant that allows the silver nanoparticle powder to be well dispersed may be added to the paste according to the present invention. The use of such a dispersant allows the independence of the particles in the paste to be ensured and also allows the reactivity between the flux component and the silver nanoparticles to be increased during their reaction, so that a uniform bonded product can be formed at lower temperatures. Any commercial general-purpose dispersant can be used so long as it has an affinity for the particle surfaces and an affinity for the dispersion medium. Only one type of dispersant may be used, or a plurality of types may be used. The amount added of the dispersant is preferably 10 percent by mass or less based on the amount of the entire paste, preferably 5 percent by mass or less, and more preferably 3 percent by mass or less.

Representative examples of the dispersant having the above-described properties include: low-molecular weight anionic compounds such as fatty acid salts (soap), α-sulfo fatty acid ester salts (MES), alkyl benzene sulfonates (ABS), linear alkyl benzene sulfonates (LAS), alkyl sulfates (AS), alkyl ether sulfates (AES), and triethanol alkyl sulfates; low-molecular weight nonionic compounds such as fatty acid ethanol amides, polyoxyethylene alkyl ethers (AE), polyoxyethylene alkyl phenyl ethers (APE), sorbitol, and sorbitan; low-molecular weight cationic compounds such as alkyl trimethyl ammonium salts, dialkyl dimethyl ammonium chlorides, and alkyl pyridinium chlorides; low-molecular weight amphoteric compounds such as alkyl carboxyl betaines, sulfobetaine, and lecithin; high-molecular weight aqueous dispersants represented by naphthalene sulfonate formalin condensates, polystyrene sulfonates, polyacrylates, salts of copolymers of vinyl compounds and carboxylic acid-based monomers, carboxymethyl cellulose, polyvinyl alcohols, and the like; high-molecular weight nonaqueous dispersants such as partial alkyl-esters of polyacrylic acid and polyalkylene polyamines; and high-molecular weight cationic dispersants such as polyethyleneimine and aminoalkyl methacrylate copolymers. However, dispersants having structures other than those exemplified above are not excluded, so long as they can be preferably applied to the particles of the invention.

Specific names of the known dispersants are listed below. However, the use of any dispersant other than those in the following list is not exclusive so long as it has the above-described properties. Examples of the specific names include BEAULIGHT LCA-H, LCA-25NH, and the like (products of Sanyo Chemical Industries, Ltd.), FLOWLEN DOPA-15B and the like (products of Kyoeisha Chemical Co., Ltd.), Solplus AX5, Solsperse 9000, Solthix 250, and the like (products of The Lubrizol Corporation), EFKA4008 and the like (products of EFKA Additives B.V.), AJISPER PA111 and the like (products of Ajinomoto Fine-Techno Co., Inc.), TEXAPHOR-UV21 and the like (products of Cognis Japan), Disper BYK2020, BYK220S, and the like (products of BYK Japan KK), DISPARLON 1751N, HIPLAAD ED-152, and the like (products of Kusumoto Chemicals, Ltd.), FTX-207S, FTERGENT 212P, and the like (products of NEOS Company Limited), AS-1100 and the like (products of Toagosei Co., Ltd.), KAOCER 2000, KDH-154, MX-2045L, HOMOGENOL L-18, RHEODOL SP-010V, and the like (products of Kao Corporation), EPAN U103, SHALLOL DC902B, NOIGEN EA-167, PLYSURF A219B, and the like (products of Dai-Ichi Kogyo Seiyaku Co., Ltd.), MEGAFAC F-477 and the like (products of DIC corporation), SILFACE SAG503A, DYNOL 604, and the like (products of Nissin Chemical Co., Ltd.), SN SPERSE 2180, SN LEVELER S-906, and the like (products of San Nopco Limited), and S-386 and the like (products of AGC Seimi Chemical Co., Ltd.).

When the formed bonding material has an appropriate viscosity, it can be easily applied to a bonding area. According to the studies by the present inventors, the viscosity is about 10 to about 250 Pa·s at room temperature, preferably about 10 to about 100 Pa·s, and more preferably about 10 to about 50 Pa·s. The viscosity value is a value under the conditions of 25° C., 5 rpm, and C(corn) 35/2.

<Production of Bonding Material (Paste)>

The bonding material according to the present invention is provided through the following production method and the like For example, silver nanoparticles obtained by the method described in Japanese Patent No. 4344001 are used. The obtained silver nanoparticles, the flux component having the above-described properties, and, if necessary, the dispersant are added to the above-described polar solvent. Then the mixture is introduced in a kneading-degassing apparatus to form a kneaded product of the above components. If necessary, the kneaded product is subjected to mechanical dispersion treatment to form a paste.

Any well-known method can be used for the mechanical dispersion treatment, so long as the particles are not significantly reformed. Specific examples of the mechanical dispersion treatment include ultrasonic dispersion, a dispersion mill, a triple roll mill, a ball mill, a bead mill, a biaxial kneader, and a planetary mixer. These may be used alone or in combination of two or more.

<Formation of Bonded Product>

A bonded portion is formed as follows. The bonding material is applied to a thickness of about 20 to about 200 μm using, for example, a metal mask, a dispenser, or screen printing. Then an object to be bonded is attached, and then the bonding material is metalized by heat treatment. The present paste can be metalized by heat treatment in nitrogen and can also be metalized by heat treatment in the air.

The use of the bonding material of the present invention allows a bonded product to be formed without pressurizing the objects to be bonded. However, this does not exclude the step of pressurization. The addition of the step of pressurizing the objects to be bonded is preferred because gases generated from the silver nanoparticles or the dispersion medium can be removed in a more efficient manner.

Generally, when pressurization is performed, the higher the pressure, the more preferred. However, a pressure higher than necessary is not required. Pressurization at about 5 MPa is sufficient because a sufficiently high bonding strength can be obtained.

<Preliminary Firing Step>

Preferably, metallization by multi-stage heat treatment is performed to form a bonded product using the paste of the present invention. More specifically, the following steps are used. A first firing step (preliminary firing step) is performed for the purpose of evaporating and removing the solvent added to the bonding material. However, if the heat treatment is performed at excessively high temperatures, not only the solvent but also the organic material forming the surfaces of the silver nanoparticles may be removed. This is not preferred because a harmful influence such as a reduction in bonding strength is exerted. More specifically, the heat treatment is performed preferably at a temperature lower than the decomposition temperature of the silver nanoparticles.

The decomposition temperature of the silver nanoparticles can greatly vary depending on the organic material that coats the surfaces of the particles, the dispersion medium, and the additives. Therefore, it is preferable to determine the thermal properties of the bonding material by, for example, TG measurement in advance. It is generally preferable that the decomposition temperature be set to a temperature lower by about 50 to about 400° C. than the preset temperature of the main firing. The time required for the preliminary firing depends on the area to be bonded. It is sufficient that the firing time is about 10 minutes. In some cases, heating for about 30 seconds is sufficient.

<Main Firing Step>

After the preliminary firing, a main firing step is performed to completely metalize the paste. A temperature rising step may be provided between the preliminary firing step and the main firing step. The temperature rising rate in the temperature rising step is in the range of 0.5 to 10° C./sec and more preferably 0.5 to 5° C./sec.

During main firing, the temperature is maintained at 150° C. or higher and 500° C. or lower for 60 minutes or shorter or 30 minutes or shorter. In this process, pressurization at 10 MPa or lower may be performed as needed.

The crystals in the thus-obtained bonded product are very large even though the crystals have grown in an inert atmosphere. Specific values of the diameters of the crystallites on the (111) plane of Ag that are computed from the half width of X-rays are 65 nm or larger even after heat treatment at 250° C. for 10 minutes. The larger these values, the more preferred, because such large values indicate that less crystal grain boundaries are formed between the particles. The diameter of the crystallites is more preferably 67 nm or larger and still more preferably 70 nm or larger.

EXAMPLES

Synthesis of Silver Nanoparticles 13.4 g of silver nitrate (a product of Toyokagaku Co., Ltd.) was dissolved in 72.1 g of pure water in a 500 mL beaker to prepare a silver solution.

Next, a 5 L beaker was charged with 1.34 L of pure water, and the pure water was bubbled with nitrogen for 30 minutes to remove dissolved oxygen and was then heated to 60° C. Then 17.9 g of sorbic acid (a product of Wako Pure Chemical Industries, Ltd.) was added. Next, 2.82 g of 28% ammonia water (a product of Wako Pure Chemical Industries, Ltd.) was added to adjust pH. In the following Examples and Comparative Examples, the addition of ammonia water starts a reaction. Five minutes after the start of the reaction, 5.96 g of hydrazine hydrate (a product of Otsuka Chemical Co., Ltd., purity: 80%) was added to the mixture under stirring.

Nine minutes after the start of the reaction, the silver solution was added and allowed to react. Then the mixture was aged for 30 minutes to form silver nanoparticles coated with sorbic acid. The silver nanoparticles were filtrated using a No. 5C paper filter and washed with pure water to obtain aggregated clusters of the silver nanoparticles. The aggregated clusters were dried in a vacuum dryer under the conditions of 80° C. for 12 hours to obtain a dry powder of the aggregated clusters of the silver nanoparticles.

90.0 g of the dry powder of the aggregated clusters of the sorbic acid-coated silver nanoparticles (average primary particle diameter: 60 nm) obtained by the above-described method was mixed with 8.80 g of terpineol (a mixture of structural isomers, a product of Wako Pure Chemical Industries, Ltd.), 1.00 g (1.0% based on the total weight of a paste) of BEAULIGHT LCA-25NH used as a wetting dispersant (a product of Sanyo Chemical Industries, Ltd.), and 0.20 g (0.2% based on the total weight of the paste) of oxydiacetic acid. The mixture was kneaded for 30 seconds using a kneading-degassing apparatus (Type V-mini 300, a product of EME Corporation) (kneading conditions/Revolution: 1,400 rpm, Rotation: 700 rpm) and then subjected to a triple roll mill (EXAKT 80S, product of EXAKT Apparatebau) five times to produce a bonding material paste. Then the obtained bonding material was applied to a substrate by a printing method. More specifically, the bonding material was applied to a silver-plated copper substrate using a metal squeegee by manual printing under the following conditions: metal mask (mask thickness: 50 μmt), pattern (2 mm), thickness (50 μm). The mixing ratio and the like are shown in Tables 1 and 2.

A chip (2 mm square silver-plated cupper substrate with a thickness of 2 mm) was mounted on the coated surface. The obtained chip-mounted product was heated in a furnace (desktop lamp heating unit, type MILA-5000, a product of ULVAC-RIKO, Inc.) at 100° C. in a nitrogen atmosphere (oxygen concentration: 50 ppm or lower) for 10 minutes to remove the solvent component in the paste (preliminary firing). To examine the specific resistance and sintered state of the fired film, a specimen with no chip mounted on the bonding material was simultaneously prepared by printing only the bonding material onto a substrate and then firing the coated substrate.

The specimens subjected to the preliminary firing were then heated to 250° C. at a temperature rising rate of 1° C./sec and subjected to heat treatment at 250° C. for 10 minutes (main firing), and a bonded product was thereby obtained. In this Example, no pressure was applied during the preliminary firing step and the main firing step. The test conditions are shown in Table 3.

The bonding strength of the obtained bonded product was examined. More specifically, the bonding strength was examined according to a method described in JISZ-03918-5:2003 "Lead-free solder test methods, Part 5, Tensile and shear test methods for solder joints." In this method, a bonding object (a chip) bonded to a substrate is pushed in a horizontal direction, and a pushing force that causes the bonding surface withstanding the force to be eventually broken is measured. In this Example, the test was performed using a bond tester (series 4000, a product of DAGE). The measurement was performed at room temperature with a shear height of 150 μm, and a test rate of 5 mm/min. The specific resistance of the fired film was measured by the four-probe method.

Figure 3:
FIG. 3 is an SEM image of a fired product according to Example 1.

The results showed that the shear strength in Example 1 was 63.5 MPa. The specific resistance value of the fired film was 3.11 μΩ·cm, and the fired film was found to have a very high conductivity. The SEM image of the obtained fired film is shown in FIG. 3. As is clear from the photograph, although the firing had been performed in nitrogen, sintering of the particles had proceeded to the extent that the shapes of the particles were not distinguishable. The above results suggest that the sintering of the particles had proceeded to a considerable extent. In the shear test method, the force (N) when the bonding surface was broken was directly measured, and this value depends on the bonding area. Therefore, to obtain a normalized value, the measured force upon breakage was divided by the bonding area (2 (mm)×2 (mm)=4 mm² in this case), and the resultant value (MPa) was defined as a shear strength. The same applies to samples described later.

The size of the crystallites in the film used for the SEM measurement in FIG. 3 was examined using an X-ray diffraction apparatus. In the method of measuring the size of the crystallites in the present invention, the measurement was performed six times on a (111) plane over the range of 40 to 50°/2θ in RINT 2100 (a product of Rigaku Corporation) using a Co radiation source (40 kV/30 mA) to obtain cumulative results. The crystallite diameter was computed from the half width β obtained by the measurement using the Scherrer equation represented by the following equation (1).

$$Dhkl = (K \cdot \lambda)/(\beta \cdot \cos \theta) \quad (1)$$

The variables in the equation (1) are as follows.
D: crystallite diameter (nm)
λ: wavelength of measurement X-rays (nm)
β: spread of diffraction width by crystallites
θ: Bragg angle of diffraction
K: Scherrer constant 1.79 was substituted for the wavelength λ of the measurement X-rays in the equation (1), and 0.94 was substituted for the Scherrer constant K. The determined crystallite diameter was 76.33 nm, and the growth of the crystal grains were found to proceed to a considerable extent.

The amount of sorbic acid (M/Z=97) detected in the range of 50 to 250° C. in an inert atmosphere was determined using TG-MS apparatuses. In the measurement method used, TG measurement was performed using Thermo Plus TG8120 (a product of Rigaku Corporation) in a helium gas flow of 100 mL/min under the temperature rising condition of 10° C./min. MS measurement was performed using a mass spectrometer QP-5000 composite system (a product of Shimadzu Corporation) with an inlet temperature of 250° C., and an interface temperature of 300° C. An EI method with 70 eV was used as an ionization method, and the mass range of scan was 10 to 500.

Figure 2:
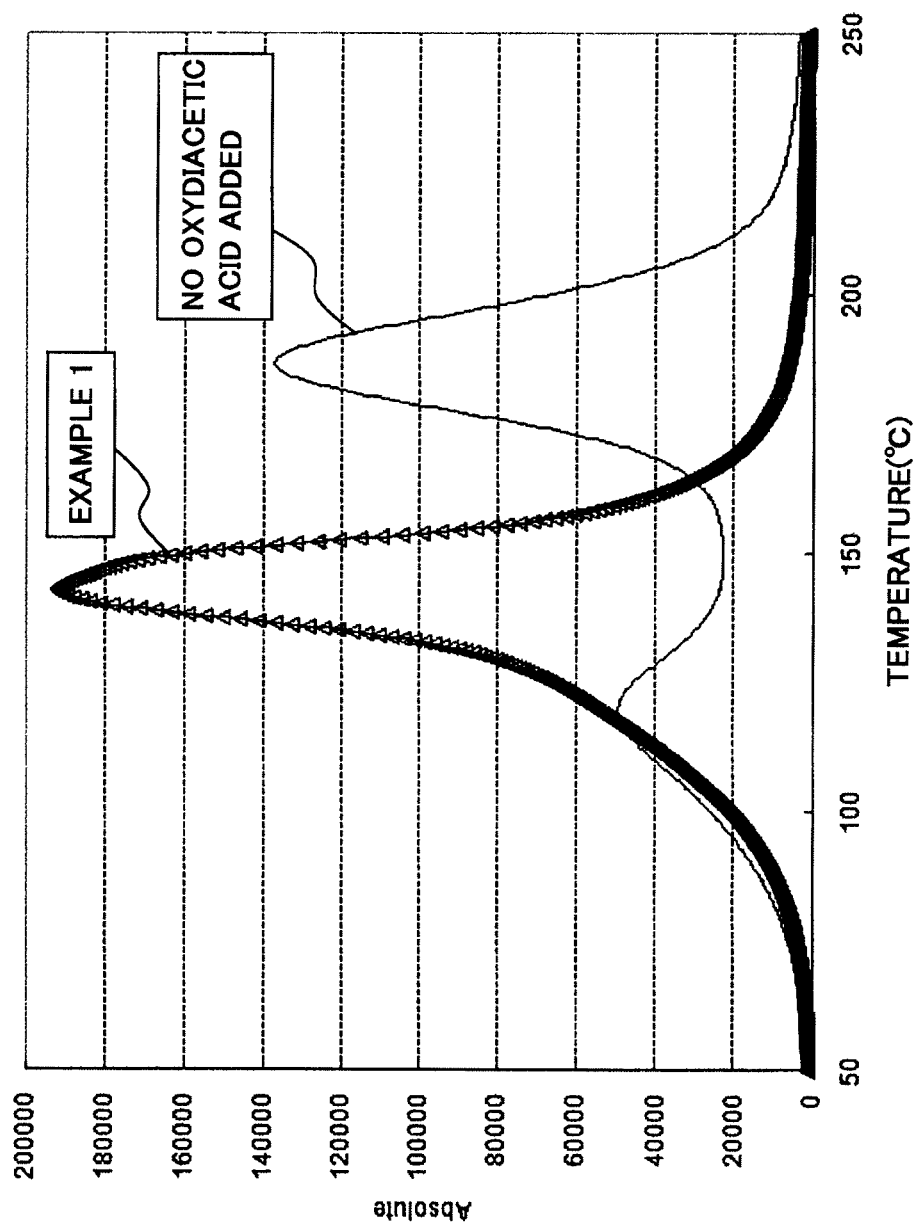
FIG. 2 is a graph showing the amount of sorbic acid (M/Z=97) detected in the range of 50 to 250° C. in an inert atmosphere for each of a paste according to the present invention and a paste containing no additive.

The results are shown in FIG. 2. The horizontal axis represents temperature, and the vertical axis represents the amount detected (counts). In the paste according to this Example (Example 1), a large amount of sorbic acid adhering to the surfaces of the silver nanoparticles was observed in the range of 100 to 150° C. However, in the results when no additive was used, a large amount of sorbic acid was observed in a relatively wide range of 100 to 200° C., and a local maximum was found in the range of 150 to 200° C.

Example 2

Figure 4:
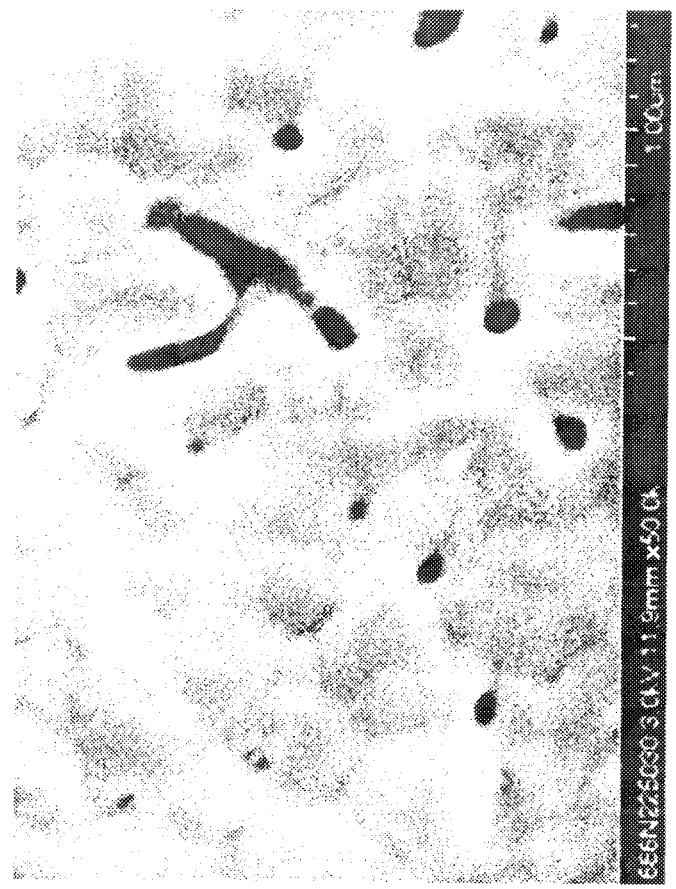
FIG. 4 is an SEM image of a fired product according to Example 2.

A bonded product and a fired film were formed by the same procedure as in Example 1 except that the conditions for the main firing were 350° C. for 5 minutes. The shear strength was 56.2 MPa and found to be very high. The specific resistance value of the fired film was 2.4 μΩ·cm, and the fired film was found to have a very high conductivity. The SEM image of the obtained fired film is shown in FIG. 4. Although the firing was performed in nitrogen, sintering of the particles had proceeded to the extent that the shapes of the particles were not distinguishable. This suggests that the sintering of the particles had proceeded to a considerable extent. The mixing ratio and the like are shown in Tables 1 and 2. The test conditions are shown in Table 3. The crystallite diameter determined as in Example 1 was 73.58 nm, and the growth of the crystal grains were found to proceed to a considerable extent, as in the results shown in the photograph.

Example 3

Example 1 was repeated using the same mixing ratio as in Example 1 except that 90.0 g of the nanoparticles (coated with sorbic acid) used as the metal component in Example 1 was replaced with a mixture of 45.0 g of spherical submicron silver particles (a product of DOWA Electronics Materials Co., Ltd., average particle diameter (D50 value): 1.0 μm) and 45.0 g of sorbic acid-coated silver nanoparticles obtained by the method described in Example 1. The total amount of the metal components was 90.0 g which was the same as that in Example 1. The results of evaluation of the obtained bonding material are shown in Table 3.

Example 4

Example 2 was repeated using the same mixing ratio as in Example 2 except that 90.0 g of the nanoparticles (coated with sorbic acid) used as the metal component in Example 2 was replaced with a mixture of 45.0 g of spherical submicron silver particles (a product of DOWA Electronics Materials Co., Ltd., average particle diameter (D50 value): 1.0 μm) and 45.0 g of sorbic acid-coated silver nanoparticles obtained by the method described in Example 1. The total amount of the metal components was 90.0 g which was the same as that in Example 2. The results of evaluation of the obtained bonding material are shown in Table 3.

Example 5

Example 2 was repeated using the same mixing ratio as in Example 2 except that 90.0 g of the nanoparticles (coated with sorbic acid) used as the metal component in Example 2 was replaced with a mixture of 22.5 g of spherical submicron silver particles (a product of DOWA Electronics Materials Co., Ltd., average particle diameter (D50 value): 1.0 μm) and 67.5 g of sorbic acid-coated silver nanoparticles obtained by the method described in Example 1. The total amount of the metal components was 90.0 g which was the same as that in Example 2. The results of evaluation of the obtained bonding material are shown in Table 3.

Example 6

Example 2 was repeated using the same mixing ratio as in Example 2 except that 90.0 g of the nanoparticles (coated with sorbic acid) used as the metal component in Example 2 was replaced with a mixture of 67.5 g of spherical submicron silver particles (a product of DOWA Electronics Materials Co., Ltd., average particle diameter (D50 value): 1.0 μm) and 22.5 g of sorbic acid-coated silver nanoparticles obtained by the method described in Example 1. The total amount of the metal components was 90.0 g which was the same as that in Example 2. The results of evaluation of the obtained bonding material are shown in Table 3.

Example 7

Example 4 was repeated using the same mixing ratio as in Example 4 except that 0.2 g oxydiacetic acid used in Example 4 was replaced with 0.1 g of oxydiacetic acid. The results of evaluation of the obtained bonding material are shown in Table 3.

Example 8

Example 7 was repeated except that the substrate plated with silver in Example 7 was replaced with a substrate with a solid copper surface. The results of evaluation of the obtained bonding material are shown in Table 3.

Example 9

Example 4 was repeated except that the substrate plated with silver in Example 4 was replaced with a substrate with a solid copper surface. The results of evaluation of the obtained bonding material are shown in Table 3.

Example 10

Example 4 was repeated except that 0.2 g of oxydiacetic acid used as the flux component in Example 4 was replaced with 0.1 g of malonic acid. The results of evaluation of the obtained bonding material are shown in Table 3.

Comparative Example 1

Figure 5:
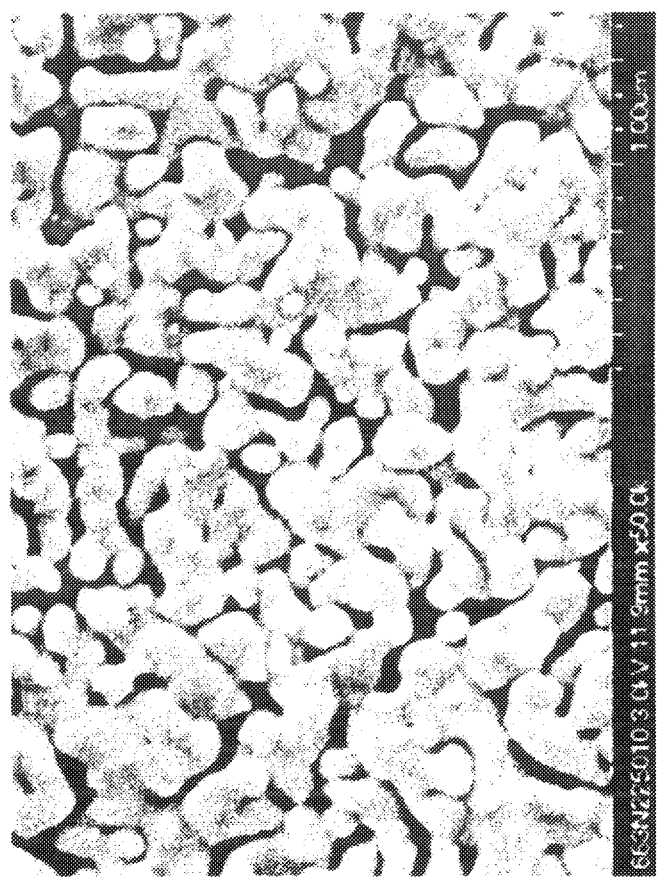
FIG. 5 is an SEM image of a fired product according to Comparative Example 1.

Tests were performed as in Example 1 except that a bonding material to which no oxydiacetic acid was added was produced. The maximum value of the shear strength was 4.0 MPa, and the average value was 2.7 MPa (the average of 5 points). Therefore, enough bonding strength was not obtained. In one of the samples, the bonding strength could not be computed. The specific resistance of the fired film was 7.77 μΩ·cm and was higher than the specific resistance in Example 1. The SEM image of the obtained fired product is shown in FIG. 5. Since the firing had been performed in nitrogen, sintering of the particles had not sufficiently proceeded, and the shapes of the individual particles were found to be distinguishable. The mixing ratio and the like are shown in Tables 1 and 2. The test conditions are shown in Table 3. The crystallite diameter determined as in Example 1 was 57.92 nm, and the growth of the crystals was found to proceed to a lesser extent than that in the Examples, as in the results shown in the photograph.

Comparative Example 2

Figure 6:
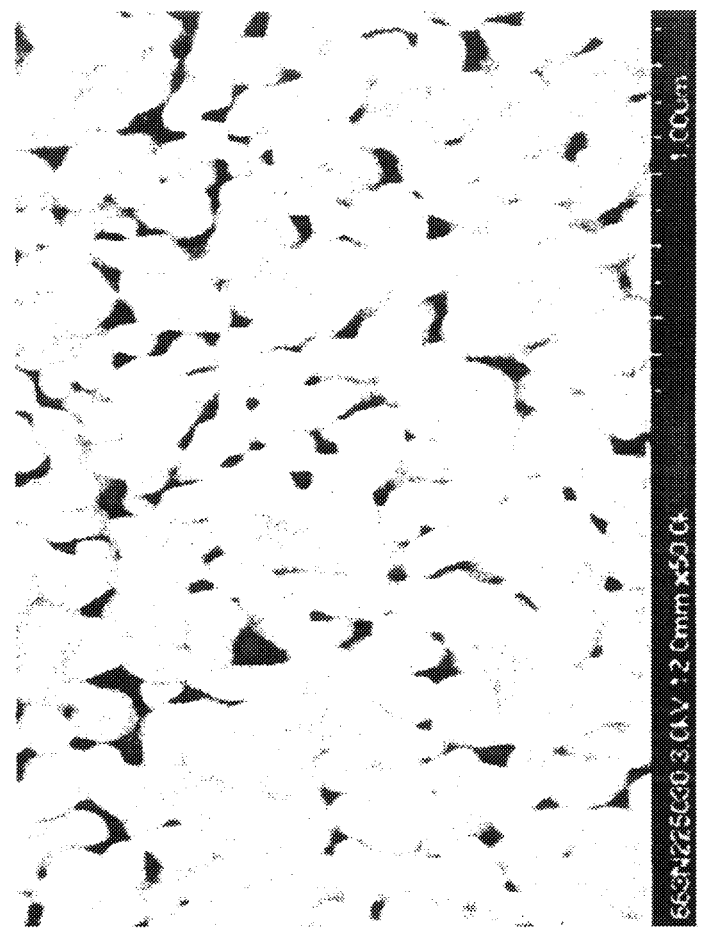
FIG. 6 is an SEM image of a fired product according to Comparative Example 2.

Tests were performed as in Example 2 except that a bonding material to which no oxydiacetic acid was added was produced. The maximum value of the shear strength was 13.2 MPa, and the average value was 9.5 MPa (the average of 5 points). Therefore, enough bonding strength was not obtained. The specific resistance of the fired film was 4.20 μΩ·cm and was higher than the specific resistance in Example 1. The SEM image of the obtained fired product is shown in FIG. 6. Since the firing had been performed in nitrogen, sintering of the particles had not sufficiently proceeded, although the degree of sintering was higher than that in Comparative Example 1. The shapes of the individual particles were found to be distinguishable. The mixing ratio and the like are shown in Tables 1 and 2. The test conditions are shown in Table 3. The crystallite diameter determined as in Example 1 was 62.68 nm, and this also shows that the growth of the crystals had proceeded to a lesser extent than that in the Examples, as in the results shown in the photograph.

Reference Example 1

A bonding object was bonded using a commercially available high-temperature solder paste (SN515 RMA A M Q M-293T, a product of NIHON SUPERIOR Co., Ltd.). The bonding was performed by coating a substrate with the paste in the air, placing the bonding object on the paste, pressurizing the object at 0.5 N, drying the paste at 150° C. for 2 minutes, and heating at 350° C. for 40 seconds to metalize the bonding material in the metal bonding surface. The bonding strength of the obtained bonded product was 36.7 MPa.

Reference Example 2

A bonding object was bonded using a commercially available lead-free solder paste (M705-K2-V, a product of Senju Metal Industry Co., Ltd.). In the bonding method used, a substrate was coated with the paste in the air, and the bonding object was placed on the paste. Then the object was pressurized at 0.5 N. The paste was dried at 150° C. for 2 minutes and heated at 250° C. for 40 seconds to metalize the bonding material in the metal bonding surface. The bonding strength of the obtained bonded product was 40.0 MPa.

TABLE 1

| | NANOPARTICLES | | | MICROPARTICLES | | | |
|---|---|---|---|---|---|---|---|
| | COATING MATERIAL | AVERAGE PRIMARY PARTICLE DIAMETER | AMOUNT ADDED | SHAPE | AVERAGE PARTICLE DIAMETER | AMOUNT ADDED | NANOPARTICLES / MICROPARTICLES |
| EXAMPLE 1 | SORBIC ACID | 60 nm | 90.0 g | — | — | — | — |
| EXAMPLE 2 | SORBIC ACID | 60 nm | 90.0 g | — | — | — | — |
| EXAMPLE 3 | SORBIC ACID | 60 nm | 45.0 g | SPHERICAL | 1.0 μm | 45.0 g | 1.0 |
| EXAMPLE 4 | SORBIC ACID | 60 nm | 45.0 g | SPHERICAL | 1.0 μm | 45.0 g | 1.0 |
| EXAMPLE 5 | SORBIC ACID | 60 nm | 67.5 g | SPHERICAL | 1.0 μm | 22.5 g | 3.0 |
| EXAMPLE 6 | SORBIC ACID | 60 nm | 22.5 g | SPHERICAL | 1.0 μm | 67.5 g | 0.3 |
| EXAMPLE 7 | SORBIC ACID | 60 nm | 45.0 g | SPHERICAL | 1.0 μm | 45.0 g | 1.0 |
| EXAMPLE 8 | SORBIC ACID | 60 nm | 45.0 g | SPHERICAL | 1.0 μm | 45.0 g | 1.0 |
| EXAMPLE 9 | SORBIC ACID | 60 nm | 45.0 g | SPHERICAL | 1.0 μm | 45.0 g | 1.0 |
| EXAMPLE 10 | SORBIC ACID | 60 nm | 45.0 g | SPHERICAL | 1.0 μm | 45.0 g | 1.0 |
| COMPARATIVE EXAMPLE 1 | SORBIC ACID | 60 nm | 90.0 g | — | — | — | — |
| COMPARATIVE EXAMPLE 2 | SORBIC ACID | 60 nm | 90.0 g | — | — | — | — |

TABLE 2

| | FLUX | | DISPERSANT | | DISPERSION MEDIUM | |
|---|---|---|---|---|---|---|
| | COMPONENT | AMOUNT ADDED | NAME | AMOUNT ADDED | COMPONENT | AMOUNT ADDED |
| EXAMPLE 1 | OXYDIACETIC ACID | 0.2 g | BEAULIGHT | 1.0 g | TERPINEOL | 8.8 g |
| EXAMPLE 2 | OXYDIACETIC ACID | 0.2 g | BEAULIGHT | 1.0 g | TERPINEOL | 8.8 g |
| EXAMPLE 3 | OXYDIACETIC ACID | 0.2 g | BEAULIGHT | 1.0 g | TERPINEOL | 8.8 g |
| EXAMPLE 4 | OXYDIACETIC ACID | 0.2 g | BEAULIGHT | 1.0 g | TERPINEOL | 8.8 g |
| EXAMPLE 5 | OXYDIACETIC ACID | 0.2 g | BEAULIGHT | 1.0 g | TERPINEOL | 8.8 g |
| EXAMPLE 6 | OXYDIACETIC ACID | 0.2 g | BEAULIGHT | 1.0 g | TERPINEOL | 8.8 g |
| EXAMPLE 7 | OXYDIACETIC ACID | 0.1 g | BEAULIGHT | 1.0 g | TERPINEOL | 8.9 g |
| EXAMPLE 8 | OXYDIACETIC ACID | 0.1 g | BEAULIGHT | 1.0 g | TERPINEOL | 8.9 g |
| EXAMPLE 9 | OXYDIACETIC ACID | 0.2 g | BEAULIGHT | 1.0 g | TERPINEOL | 8.8 g |
| EXAMPLE 10 | MALONIC ACID | 0.1 g | BEAULIGHT | 1.0 g | TERPINEOL | 8.9 g |
| COMPARATIVE EXAMPLE 1 | | | BEAULIGHT | 1.0 g | TERPINEOL | 9.0 g |
| COMPARATIVE EXAMPLE 2 | | | BEAULIGHT | 1.0 g | TERPINEOL | 9.0 g |

TABLE 3

| | SUBSTRATE | | FIRING CONDITIONS | | | |
|---|---|---|---|---|---|---|
| | | | | PRELIMINARY FIRING | | |
| | SILVER PLATING | SOLID COPPER | ATMOSPHERE | FIRING TEMPERATURE | FIRING TIME | TEMPERATURE RISING RATE |
| EXAMPLE 1 | ○ | | NITROGEN | 100° C. | 10 MINUTES | 1° C./SECOND |
| EXAMPLE 2 | ○ | | NITROGEN | 100° C. | 10 MINUTES | 1° C./SECOND |
| EXAMPLE 3 | ○ | | NITROGEN | 100° C. | 10 MINUTES | 1° C./SECOND |
| EXAMPLE 4 | ○ | | NITROGEN | 100° C. | 10 MINUTES | 1° C./SECOND |
| EXAMPLE 5 | ○ | | NITROGEN | 100° C. | 10 MINUTES | 1° C./SECOND |
| EXAMPLE 6 | ○ | | NITROGEN | 100° C. | 10 MINUTES | 1° C./SECOND |
| EXAMPLE 7 | ○ | | NITROGEN | 100° C. | 10 MINUTES | 1° C./SECOND |
| EXAMPLE 8 | | ○ | NITROGEN | 100° C. | 10 MINUTES | 1° C./SECOND |

TABLE 3-continued

| | | | FIRING CONDITIONS PRE-FIRING | | | |
|---|---|---|---|---|---|---|
| | | | ATMOSPHERE | TEMPERATURE | TIME | RATE |
| EXAMPLE 9 | | ○ | NITROGEN | 100° C. | 10 MINUTES | 1° C./SECOND |
| EXAMPLE 10 | ○ | | NITROGEN | 100° C. | 10 MINUTES | 1° C./SECOND |
| COMPARATIVE EXAMPLE 1 | ○ | | NITROGEN | 100° C. | 10 MINUTES | 1° C./SECOND |
| COMPARATIVE EXAMPLE 2 | ○ | | NITROGEN | 100° C. | 10 MINUTES | 1° C./SECOND |

| | FIRING CONDITIONS MAIN FIRING | | | EVALUATION RESULTS | |
|---|---|---|---|---|---|
| | ATMOSPHERE | FIRING TEMPERATURE | FIRING TIME | SPECIFIC RESISTANCE | SHEAR STRENGTH |
| EXAMPLE 1 | NITROGEN | 250° C. | 10 MINUTES | 3.11 μΩ·cm | 63.9 MPa |
| EXAMPLE 2 | NITROGEN | 350° C. | 5 MINUTES | 2.40 μΩ·cm | 56.2 MPa |
| EXAMPLE 3 | NITROGEN | 250° C. | 10 MINUTES | 3.70 μΩ·cm | 42.5 MPa |
| EXAMPLE 4 | NITROGEN | 350° C. | 5 MINUTES | 3.60 μΩ·cm | 35.8 MPa |
| EXAMPLE 5 | NITROGEN | 350° C. | 5 MINUTES | 3.30 μΩ·cm | 44.3 MPa |
| EXAMPLE 6 | NITROGEN | 350° C. | 5 MINUTES | 7.20 μΩ·cm | 30.8 MPa |
| EXAMPLE 7 | NITROGEN | 350° C. | 5 MINUTES | 2.90 μΩ·cm | 56.1 MPa |
| EXAMPLE 8 | NITROGEN | 350° C. | 5 MINUTES | — | 31.6 MPa |
| EXAMPLE 9 | NITROGEN | 350° C. | 5 MINUTES | — | 48.8 MPa |
| EXAMPLE 10 | NITROGEN | 350° C. | 5 MINUTES | 3.10 μΩ·cm | — |
| COMPARATIVE EXAMPLE 1 | NITROGEN | 250° C. | 5 MINUTES | 7.77 μΩ·cm | 4.0 MPa |
| COMPARATIVE EXAMPLE 2 | NITROGEN | 350° C. | 5 MINUTES | 4.20 μΩ·cm | 13.2 MPa |

The details of the reason for the above effects are not clear. However, the following reaction mechanism can be considered. The reaction mechanism will be considered with reference to the TG diagram shown in FIG. 1. The behavior of general silver nanoparticles (silver nanoparticles coated with sorbic acid in FIG. 1) is represented by a curve 10. The TG behavior of a paste having the configuration of the present invention is represented by a curve 20, and the curve 20 shows that the reaction proceeds at lower temperatures. The decomposition temperature of diglycolic acid used as the flux component added is higher (curve 30). Therefore, it is clear that the reduction is not caused by the diglycolic acid. Referring to the TG behavior of sorbic acid represented by alternate long and short dashed lines (curve 40), the TG behavior of the paste substantially agrees with the TG behavior of the sorbic acid. This suggests that the sorbic acid does not adhere to the surfaces of the silver nanoparticles but is present independently in the paste. Therefore, it is presumed that the addition of diglycolic acid to the paste has the effect of at least removing the sorbic acid that coats the surfaces. It is considered that this behavior allows the silver nanoparticles to be converted to silver even in a low-reactive environment in which no oxygen and the like are present around the particles.

In addition, the use of the bonding agent according to the present invention allows a bonded product having a bonding strength much higher than that obtained when a commercially available solder paste is used for bonding to be obtained even when firing has been performed in nitrogen.

INDUSTRIAL APPLICABILITY

The bonding performed according to the present invention can be applied to non-insulated type semiconductor devices and a bear chip mounting-assembling technology and can also be applied to a bonding step performed during production of power devices (IGBTs, rectifier diodes, power transistors, power MOSFETs, insulated-gate bipolar transistors, thyristors, gate turn-off thyristors, and triacs). The bonding material can be applied to a bonding material for glass having a chromium-treated surface and can be used for electrodes and frames of lighting devices using LEDs.

The invention claimed is:

1. A bonding material comprising:
silver nanoparticles having an average primary particle diameter of 1 to 200 nm and coated with an organic material having 1-8 carbon atoms;
a flux component of oxydiacetic acid; and
a dispersion medium.

2. The bonding material according to claim 1, comprising silver particles having an average particle diameter of 0.5 μm or larger and 3.0 μm or smaller.

3. The bonding material according to claim 1, wherein the number of carbon atoms of the organic material is 6.

4. The bonding material according to claim 1, wherein the dispersion medium is a polar solvent.

* * * * *